United States Patent
Takeda et al.

(10) Patent No.: US 9,481,606 B2
(45) Date of Patent: Nov. 1, 2016

(54) DIELECTRIC COMPOSITION, DIELECTRIC FILM, AND ELECTRONIC COMPONENT

(71) Applicant: TDK CORPORATION, Tokyo (JP)

(72) Inventors: Saori Takeda, Tokyo (JP); Toshihiko Kaneko, Tokyo (JP); Yuki Yamashita, Tokyo (JP); Yuji Sezai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/529,623

(22) Filed: Oct. 31, 2014

(65) Prior Publication Data

US 2015/0124373 A1    May 7, 2015

(30) Foreign Application Priority Data

Nov. 7, 2013 (JP) ................. 2013-231182
Aug. 29, 2014 (JP) ................. 2014-175731

(51) Int. Cl.

| | |
|---|---|
| *H01L 21/02* | (2006.01) |
| *C04B 35/453* | (2006.01) |
| *H01G 4/12* | (2006.01) |
| *H01G 4/33* | (2006.01) |
| *H01L 49/02* | (2006.01) |
| *H01G 4/08* | (2006.01) |

(52) U.S. Cl.
CPC .......... *C04B 35/453* (2013.01); *H01G 4/1209* (2013.01); *H01G 4/1272* (2013.01); *H01G 4/33* (2013.01); *H01L 28/55* (2013.01); *C04B 2235/3427* (2013.01); *H01G 4/085* (2013.01)

(58) Field of Classification Search
None
See application file for complete search history.

(56) References Cited

U.S. PATENT DOCUMENTS 6,307,225 B1* 10/2001 Kijima ............. H01L 21/28194
148/33.3

FOREIGN PATENT DOCUMENTS

| | | | |
|---|---|---|---|
| JP | 2000-323591 A | | 11/2000 |
| JP | 2000323591 A | * | 11/2000 |

OTHER PUBLICATIONS

Veber et al., Synthesis and microstructural characterization of Bi12SiO20 (BSO) thin films produced by the sol-gel process, Aug. 25, 2009, vol. 36, pp. 245-250.*
Veber et al., "Synthesissis and microstructural characterization of Bi12SiO20 (BSO) thin films produced by the sol-gel process", Ceramics International, vol. 36, No. 1, 2010, pp. 245-250.*
Veber et al., "Synthesis and Microstructural Characterization of Bi12SiO20 (BSO) Thin Films Produced by the Sol-Gel Process", Ceramics International, Aug. 25, 2009, pp. 245-250, vol. 36, No. 1, Elsevier, Amsterdam, NL.
Mar. 16, 2015 extended European Search Report issued in European Application No. 14192109.8.
Valant et al., "Processing and Dielectric Properties of Sillenite Compunds $Bi_{12}MO_{20-\delta}$ (M = Si, Ge, Ti, Pb, Mn, $B_{1/2}P_{1/2}$)," *J. Am. Ceram. Soc.*, 2001, vol. 84, No. 12, 2900-2904.

* cited by examiner

*Primary Examiner* — Earl Taylor
*Assistant Examiner* — Samuel Park
(74) *Attorney, Agent, or Firm* — Oliff PLC

(57) ABSTRACT

A dielectric composition containing a crystalline phase represented by a general formula of $Bi_{12}SiO_{20}$ and a crystalline phase represented by a general formula of $Bi_2SiO_5$ as the main components. The dielectric composition contains preferably 5 mass % to 99 mass % of the $Bi_2SiO_5$ crystalline phase, and more preferably 30 mass % to 99 mass %.

6 Claims, 1 Drawing Sheet

DIELECTRIC COMPOSITION, DIELECTRIC FILM, AND ELECTRONIC COMPONENT

The present invention relates to a dielectric composition, a dielectric film and an electronic component.

BACKGROUND

Recently, with miniaturization and high performance of the devices such as smart phone, notebook computer and the like, densification of electrical circuits is accelerating. Thus, low-back of electronic components is in progress, and the requirement on the thin layer of the structure becomes stricter and stricter.

Among them, examples using dielectric compositions include thin film capacitors, ceramic capacitors, and the like. They are widely applied in the use of dielectric resonators or decoupling capacitors as electronic components with a high performance, and thus, they are required to have a high relative permittivity, a small change of the electrostatic capacity relative to temperature (hereinafter, it is recorded as the temperature characteristic of electrostatic capacity), and a high Q value.

In addition, with densification of a circuit, it will turn to be a high temperature due to the heat generated from an electronic component. Thus, it is required that the using environment temperature falls within a wide range of −55° C. to 125° C.

Up till now, the materials represented by a general formula of $(Ba_{1-x}Sr_x)(Ti_{1-x}Zr_x)O_3$ are used as the material with good temperature characteristics of electrostatic capacity. However, these materials with bulk shape show a good temperature characteristic of electrostatic capacity, but when they are made into dielectric films, there is a problem that the relative permittivity will decrease due to the size effect of the crystal particles. Thus, the requirement for miniaturization of such electronic components can not be met. Therefore, the development of the materials which have both a high relative permittivity and a good temperature characteristic of electrostatic capacity is progressing.

For example, in the Non-Patent Literature 1, it is disclosed that the temperature characteristic of electrostatic capacity of $Bi_{12}SiO_{20}$ is small. However, although $Bi_{12}SiO_{20}$ shows a good temperature characteristic of electrostatic capacity, its relative permittivity is as low as 38.

NON-PATENT LITERATURE

Non-Patent Literature 1: Journal American Ceramic Society Vol. 84 No. 12 P2900~2904, Processing and Dielectric Properties of Sillenite Compounds $Bi_{12}MO_{20-o}$ (M=Si, Ge, Ti, Pb, Mn, $B_{1/2}$, $P_{1/2}$), Matjaz Valent, Danilo Suvorov.

SUMMARY

The present invention is accomplished in view of such actual situation. The purpose of the present invention is to provide a dielectric composition and a dielectric film which maintain a high relative permittivity and show a good temperature characteristic of electrostatic capacity. Also the present invention aims at providing an electronic component with a high electrostatic capacity and a good temperature characteristic of electrostatic capacity by having electrodes and dielectric layer(s) containing dielectric composition mentioned above.

In order to achieve the above aim, the dielectric composition according to the present invention characterized in that it contains a crystalline phase represented by a general formula of $Bi_{12}SiO_{20}$ and a crystalline phase represented by a general formula of $Bi_2SiO_5$ as the main components.

The content of the crystalline phase of $Bi_2SiO_5$ is preferably 5 mass % to 99 mass %, and more preferably 30 mass % to 99 mass %.

In addition, the dielectric film preferably contains the above dielectric composition as the main component.

In the electronic component containing dielectric layer(s) and electrodes, it preferably contains the above dielectric composition as the main component of the dielectric layer.

The present invention can provide a dielectric composition and a dielectric film which maintain a high relative permittivity and show a good temperature characteristic of electrostatic capacity. Also, the present invention can provide an electronic component with a high electrostatic capacity and a good temperature characteristic of electrostatic capacity by having electrodes and dielectric layer(s) containing the dielectric composition mentioned above.

DETAILED DESCRIPTION OF EMBODIMENTS

Hereinafter, an embodiment of the present invention is described with reference to the figures.

As for the embodiment of the present invention, the shape is not particularly limited. In the dielectric film, the effect of the dielectric composition is evaluated with the thin film capacitor having the shape shown as follows.

<Thin Film Capacitor 10>

Figure 1:
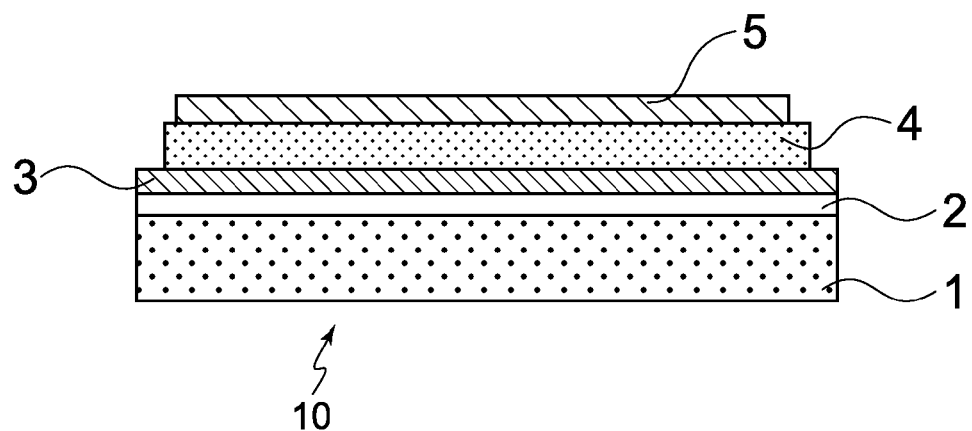
FIG. 1 is a cross-section view of the thin film capacitor according to an embodiment of the present invention.

As shown in FIG. 1, a thin film capacitor 10 according to the present embodiment has a lower electrode structure 3, an upper electrode structure 5 and a dielectric film 4 on a foundation layer 2 which is prepared on the surface of a supporting substrate 1. And, the dielectric film 4 is disposed between the lower electrode structure 3 and the upper electrode structure 5. The supporting substrate 1 has a function to ensure the mechanical strength of the whole thin film capacitor 10. The foundation layer 2 plays a role in bonding the supporting substrate, a electrode film of the lower electrode structure 3 and the dielectric film 4.

<Supporting Substrate 1>

The material for forming the supporting substrate 1 as shown in FIG. 1 is not particularly limited. The supporting substrate 1 can be formed with a single crystal such as Si single crystal, SiGe single crystal, GaAs single crystal, InP single crystal, $SrTiO_3$ single crystal, MgO single crystal, $LaAlO_3$ single crystal, $ZrO_2$ single crystal, $MgAl_2O_4$ single crystal, $NdGaO_3$ single crystal, or a ceramic polycrystalline substrate such as $Al_2O_3$ polycrystal, ZnO polycrystal, $SiO_2$ polycrystal, or a metal substrate and so on. Among them, Si single crystal is the most preferable due to the low cost. The surface of the supporting substrate 1 needs to carry out an insulating treatment to make the current not flow into the supporting substrate 1 in use. For example, an insulating layer can be formed by oxidizing the surface of the supporting substrate 1 or a film can be formed on the surface of the supporting substrate 1 with an insulator such as $Al_2O_3$, $SiO_2$, $Si_3N_4$ and the like. The thickness of the supporting substrate 1 is not particularly limited as long as it can ensure the mechanical strength of the whole thin film capacitor. For example, it can be set to be 10 nm to 1000 nm.

<Foundation Layer 2>

In the present invention, the thin film capacitor 10 shown in FIG. 1 preferably have a foundation layer 2 on the surface of the supporting substrate 1 dealt with the insulating treatment. The foundation layer 2 plays a role in bonding the electrode film which is used as the lower electrode structure 3 to the supporting substrate 1, and bonding the dielectric film 4 to the electrode film which is used as the lower electrode structure 3. If the foundation layer 2 is annealed, oxide is formed in a part of the foundation layer 2 and it precipitates on the electrode film of the lower electrode structure 3. Thus, the dielectric film 4 and the electrode film that is used as the lower electrode structure 3 can be bonded. The material for forming the foundation layer 2 is not particularly limited as long as it can bond the electrode film which is used as the lower electrode structure 3 to the supporting substrate 1, and bond the dielectric film 4 to the electrode film which is used as the lower electrode structure 3. For example, the foundation layer 2 can be formed with the oxide of titanium or chromium, and the like.

If no peeling occurs between the supporting substrate 1 and the electrode film which is the lower electrode structure 3 and between the dielectric film 4 and the electrode film which is the lower electrode structure 3, a foundation layer 2 may not be added between the supporting substrate 1 and the lower electrode structure 3, and between the lower electrode structure 3 and the dielectric film 4.

<Lower Electrode Structure 3>

The material for forming the lower electrode structure 3 is not particularly limited as long as it is conductive. It can be formed with a metal such as platinum (Pt), ruthenium (Ru), rhodium (Rh), palladium (Pd), iridium (Ir), gold (Au), silver (Ag), copper (Cu), nickel (Ni) and the like, and etc. Among these materials, in the case of being used in the high-frequency electronic components, Cu is the most preferable material. In the present invention, Bi (bismuth) with a low melting point is used, and thus the material can be fired under a low temperature that is 150° C. or more lower than the $(Ba_{1-x}Sr_x)(Ti_{1-x}Zr_x)O_3$-based material which is used as the material with a fine temperature characteristic of electrostatic capacity nowadays. Therefore, Cu with a low melting point can be used as the electrode material. The thickness of the lower electrode structure 3 is not particularly limited as long as it can function as one electrode of the thin film capacitor. For example, it can be set to be 10 nm to 10000 nm.

After the lower electrode structure 3 being formed, annealing is carried out to strengthen the bonding of the supporting substrate 1, the foundation layer 2 and the lower electrode structure 3. The heating rate in the annealing process is preferably 50° C./hr to 8000° C./hr, and more preferably 100° C./hr to 8000° C./hr. The holding temperature in the annealing process is preferably 400° C. to 800° C., and more preferably 400° C. to 700° C. Its holding time is preferably 0.1 hour to 4 hours, and more preferably 0.2 hour to 3 hours, and particularly preferably 0.5 hour to 2 hours.

<Dielectric Film 4>

The dielectric film 4 is composed of the dielectric composition according to the present embodiment. The dielectric composition is a dielectric composition containing a crystalline phase represented by a general formula of $Bi_{12}SiO_{20}$ and a crystalline phase represented by a general formula of $Bi_2SiO_5$ as the main components. The main components mentioned here refer to the compounds contained 50 mass % or more in the dielectric film.

The cubic $Bi_{12}SiO_{20}$ that is a paraelectric material will lead to crystal lattice distortion in the interface between $Bi_{12}SiO_{20}$ and $Bi_2SiO_5$ by containing orthorhombic $Bi_2SiO_5$. It is considered that ionic polarizability is enhanced by this crystal lattice distortion, and thus its relative permittivity become higher than that of the single phase of the $Bi_{12}SiO_{20}$ crystal layer. It is believed that because the effect of increasing the ionic polarization is high, the system can achieve an unprecedented high relative permittivity by only 5 mass % or more of $Bi_2SiO_5$ contained in the paraelectric material of $Bi_{12}SiO_{20}$.

In addition, it is predicted that the Curie point of $Bi_2SiO_5$ falls into a high temperature higher than 150° C. The relative permittivity will become high with the increase of the temperature, and the temperature characteristic of electrostatic capacity will deteriorate and become large. On the other hand, the relative permittivity of the paraelectric material of $Bi_{12}SiO_{20}$ changes little relative to temperature. Thus, it is presumed that crystal lattice distortion will occur in the orthorhombic $Bi_2SiO_5$ by containing cubic $Bi_{12}SiO_{20}$, and thus the Curie point will shift to a higher temperature. Therefore, the increase of the relative permittivity could be inhibited in the temperature range of −55° C. to 125° C., and a good temperature characteristic of electrostatic capacity could be achieved.

Besides, in the present invention, $Bi_2SiO_5$ has a layer structure with $Bi_2O_3$ layers and $SiO_2$ layers laminated alternately. Thus, even if only 1 mass % of $Bi_{12}SiO_{20}$ is contained, the ordinality in a part of it will break up, and thus an effect of shifting the Curie point to a higher temperature will be produced and a good temperature characteristic of electrostatic capacity can be obtained. Because of this effect, a good temperature characteristic of electrostatic capacity is shown with a higher value than the assumed one obtained by simply adding the temperature characteristic value of electrostatic capacity of $Bi_2SiO_5$ to that of $Bi_{12}SiO_{20}$.

The content of the crystalline phase of $Bi_2SiO_5$ in the dielectric composition is preferably 5 mass % to 99 mass %, and more preferably 30 mass % to 99 mass %. By being such range, a good temperature characteristic of electrostatic capacity can be maintained and the relative permittivity can be increased. As the temperature characteristic of electrostatic capacity of the dielectric composition is 1000 ppm/° C. or less, it can meet the COM standards of the EIA specification. The dielectric composition contains a $Bi_2O_3$ crystal phase or a $SiO_2$ amorphous phase as the tertiary phase in a nonequilibrium state of reaction, and these phases will not deteriorate the dielectric properties largely.

The dielectric film according to the present embodiment can further contain other components such as transition elements or rare earth elements and etc. according to the desired properties.

The thickness of the dielectric film 4 is preferably 50 nm to 2000 nm, and more preferably 100 nm to 2000 nm, and further more preferably 200 nm to 2000 nm. If it is 50 nm or less, dielectric breakdown will occurs easily. In the case of 2000 nm or more, the obtained electrostatic capacity will be reduced, and thus it is not preferred. Additionally, the material will become dense by being made into a dielectric film, and a high relative permittivity can be obtained.

The dielectric film 4 can be formed with all kinds of deposition method such as vacuum deposition method, sputtering method, pulsed laser deposition method (PLD method), metal-organic chemical vapor deposition method (MOCVD), metal organic decomposition method (MOD) or chemical solution deposition methods like sol-gel method and the like, or etc.

After the forming of the dielectric film 4, annealing is carried out. The heating rate in the annealing process is preferably 50° C./hr to 8000° C./hr, and more preferably 200° C./hr to 8000° C./hr. The holding temperature in the annealing process is preferably 650° C. or less, and more preferably 450° C. to 650° C. The holding time is preferably 0.1 hour to 4 hours, more preferably 0.2 hour to 3 hours, and particularly preferably 0.2 hour to 2 hours. By making the holding temperature and the holding time fall within such ranges, the volatilization of Bi can be inhibited, a metastable phase of $Bi_2SiO_5$ crystal phase can be generated, and a dielectric composition containing a crystalline phase represented by a general formula of $Bi_{12}SiO_{20}$ and a crystalline phase represented by a general formula of $Bi_2SiO_5$ as the main components can be obtained.

<Upper Electrode Structure 5>

In the present invention, the thin film capacitor has an upper electrode structure 5 on the surface of the dielectric film 4 which functions as the other electrode of the thin film capacitor. The material for forming the upper electrode structure 5 is not particularly limited as long as it is conductive. The upper electrode structure 5 can be formed by the same material as that of the lower electrode structure 3. Further, as the electrode film used as the upper electrode structure 5 can be formed under a room temperature, base metals such as iron (Fe), nickel (Ni) and etc. or alloy such as tungsten silicide (WSi), molybdenum silicide (MoSi) and etc. can be used to form the film of the upper electrode structure. The thickness of the upper electrode structure 5 is not particularly limited as long as it can function as the other electrode of the thin film capacitor. For example, it can be set to be 10 nm to 10000 nm.

In the embodiment mentioned above, thin film capacitor is illustrated as the electronic component according to the present invention. However, the electronic component according to the present invention is not limited to the thin film capacitor, and it can be any electronic component containing the above dielectric composition.

Figure 2:
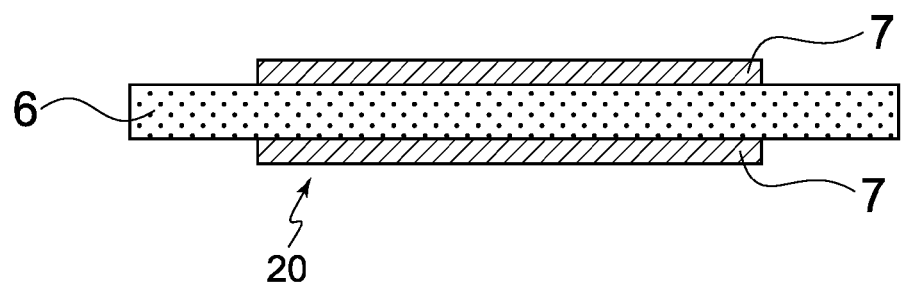
FIG. 2 is a cross-section view of the single plate capacitor according to an embodiment of the present invention.

Moreover, a single plate capacitor also can be obtained in the present invention. The single plate capacitor has a dielectric layer disposed between electrode layers as shown in FIG. 2. The dielectric layer contains a crystalline phase represented by a general formula of $Bi_{12}SiO_{20}$ and a crystalline phase represented by a general formula of $Bi_2SiO_5$ as the main components.

<Single Plate Capacitor 20>

As shown in FIG. 2, the single plate capacitor 20 according to the present embodiment has electrode layers 7 and a dielectric layer 6 which is disposed between the two electrode layers 7.

The shape of the single plate capacitor 20 is not particularly limited and the size also is not particularly limited. It can be a size suitable for using and for example it can be set as 10 mm×10 mm×1 mm and the like.

<Dielectric Layer 6>

The dielectric layer 6 is composed of the dielectric composition according to the present embodiment. The dielectric composition contains a crystalline phase represented by a general formula of $Bi_{12}SiO_{20}$ and a crystalline phase represented by a general formula of $Bi_2SiO_5$ as the main components. The content of $Bi_2SiO_5$ crystalline phase is preferably 5 mass % to 99 mass %, and more preferably 30 mass % to 99 mass %. Thus, a high relative permittivity can be maintained and a good temperature characteristic of electrostatic capacity can be realized.

The thickness of the dielectric layer 6 is not particularly limited. It can be properly decided according to the desired properties and the use and etc. For example, it can be set to be 0.1 mm to 3 mm.

<Electrode Layer 7>

The conductive material contained in the electrode layer 7 is not particularly limited as long as it is conductive. It can be properly selected from conductive materials such as metals like platinum (Pt), indium-gallium (In—Ga), palladium (Pd), gold (Au), silver (Ag), copper (Cu), and the like. The thickness of the electrode layer 7 is not particularly limited as long as it can function as an electrode.

<Method for Manufacturing Single Plate Capacitor>

The single plate capacitor of the present embodiment is manufactured by sandwiching a dielectric layer between two electrode layers. And the dielectric layer contains a crystalline phase represented by a general formula of $Bi_{12}SiO_{20}$ and a crystalline phase represented by a general formula of $Bi_2SiO_5$ as the main components. Hereinafter, the manufacturing method is described specifically.

Firstly, a specified amount of $Bi_2O_3$ powders and $SiO_2$ powders are prepared as the dielectric material for forming the dielectric layer 6. And then they are mixed as well as a solvent by a ball mill.

The solvent used for mixing can be organic solvent, and also can be water.

The organic solvent is not particularly limited, and can be properly selected from various organic solvents such as ethanol, acetone, toluene and the like.

After mixing, the mixed solution is dried. The drying method is not particularly limited, and can be properly selected. In the case of drying with a thermostat, the drying temperature is not particularly limited as long as the solvent can evaporate. In the case of freeze-drying, the freezing temperature is preferably 30° C. lower than the freezing point of the mixed solution, and more preferably 40° C. to 50° C. lower than the freezing point of the mixed solution.

The dried mixture powders are added into a platinum crucible to be melted. The holding temperature during melting is preferably 900° C. or higher, and more preferably 1000° C. to 1050° C. The holding time is preferably 1 hour or more, and more preferably 2 hours to 5 hours. The volatilization of Bi can be inhibited by making the holding temperature and the holding time fall within such ranges, and then a specified composition can be obtained.

The melted material is then quenched in cold water until 100° C. or less to obtain an intermediate.

The obtained intermediate is cut and then polished to obtain a single plate sample. The size is not particularly limited. For example, it can be set to be 10 mm×10 mm×1 mm and the like. It also can be properly determined according to the desired properties or use and etc.

The single plate sample is then annealed. The holding temperature in the annealing process is preferably 830° C. or less, more preferably 400° C. to 700° C., and particularly preferably 400° C. to 550° C. The holding time is preferably 1 day or more, more preferably 3 days to 7 days, and particularly preferably 5 days to 7 days. Then, a dielectric layer is obtained. By making the holding temperature and the holding time fall into such ranges, a metastable phase of $Bi_2SiO_5$ crystal phase can be generated, and a dielectric composition containing a $Bi_{12}SiO_{20}$ crystalline phase and a $Bi_2SiO_5$ crystalline phase can be obtained.

As shown in FIG. 2, electrodes are coated on the dielectric layer to form a single plate capacitor. The conductive material contained in the electrodes is not particularly limited as long as it is conductive. It can be properly selected from conductive materials such as metals like platinum (Pt), indium-gallium (In—Ga), palladium (Pd), gold (Au), silver (Ag), copper (Cu) and the like.

Hereinbefore, embodiments of the present invention are described, but the invention is not restricted by the embodiments mentioned above. It can make various changes without deviating from the scope of the present invention.

EXAMPLES

Hereinafter, the present invention is specifically described based on the examples. However, the present invention is not restricted by the examples.

Examples 1 to 7

Examples 1 to 7 were thin film capacitors obtained by forming dielectric films using a sputtering method. Firstly, a foundation layer of Ti film with a thickness of 50 nm was formed by a sputtering method on the surface of a substrate with a square of 10 mm×10 mm, and the substrate had $SiO_2$ on the surface of Si.

Next, a Pt film used as the lower electrode structure was formed on the obtained Ti film by a sputtering method and the thickness of the Pt film was made be 50 nm.

Then, the formed Pt/Ti film was annealed under a condition with a heating rate of 200° C./hr, a holding temperature of 650° C., a holding time of 0.5 hr and an atmosphere of air.

The target for sputtering was prepared by a solid-phase method, and the target was used to form the dielectric film containing a crystalline phase represented by $Bi_{12}SiO_{20}$ and a crystalline phase represented by $Bi_2SiO_5$ as the main components.

The component ratio of the $Bi_{12}SiO_{20}$ crystalline phase and the $Bi_2SiO_5$ crystalline phase could be adjusted by the mass ratio of the starting materials of $Bi_2O_3$ and $SiO_2$.

Firstly, the target was essential for forming the dielectric film containing a crystalline phase represented by $Bi_{12}SiO_{20}$ and a crystalline phase represented by $Bi_2SiO_5$ as the main components. As for the starting materials of the target for sputtering, $Bi_2O_3$ powders and $SiO_2$ powders were prepared respectively and the mass ratio of the target materials of $Bi_2O_3$ and $SiO_2$ in Examples 1 to 7 was adjusted as shown in Table 1.

Subsequently, water was used as the solvent, and the powders were wet-mixed for 20 hours. Then the mixed powders were dried under 100° C.

The obtained mixed powders were pressed to obtain a molded body. The condition for molding was that the pressure was $2.0\times10^8$ Pa, and the temperature was 25° C.

Then, the molded body was sintered in a condition with a holding temperature of 850° C., a holding time of 2 hours and an atmosphere of air.

Next, the obtained sintered body was processed into a shape of 200 mmϕ and a thickness of 6 mm by a flat-surface grinding machine and a cylindrical sanding machine, and a target for sputtering was obtained. The target was essential for forming the dielectric film containing a crystalline phase represented by $Bi_{12}SiO_{20}$ and a crystalline phase represented by $Bi_2SiO_5$ as the main components.

In order to form a dielectric film (the dielectric film contained a crystalline phase represented by $Bi_{12}SiO_{20}$ and a crystalline phase represented by $Bi_2SiO_5$ as the main components) on the annealed lower electrode structure film, deposition was conducted with the above target by a sputtering method under a condition with the atmosphere being argon (Ar)/oxygen ($O_2$)=2/1, the pressure being 1.2 Pa, a high-frequency power being 200 W and the substrate temperature being room temperature. After that, annealing was carried out under the following condition to obtain a dielectric film. The thickness of the dielectric film was 400 nm.

The condition for annealing was that the heating rate was 600° C./hr, the holding temperature was 490° C., the holding time was 2 hours, and the atmosphere was air.

Next, a Pt film used as the upper electrode structure with a diameter of 5 mm and a thickness of 50 nm was formed on the obtained dielectric film by a sputtering method using a mask, and thus the thin film capacitor samples of Examples 1 to 7 shown in FIG. 1 were obtained.

The relative permittivity, the temperature characteristic of electrostatic capacity, and the mass ratio of $Bi_{12}SiO_{20}$ crystalline phase and $Bi_2SiO_5$ crystalline phase of the obtained thin film capacitor were measured with the following methods respectively.

<Relative Permittivity $\in_r$>

The relative permittivity $\in_r$ was calculated from the electrostatic capacity C of the dielectric sample. The electrostatic capacity C was measured by a digital LCR meter (4274A manufactured by YHP Corporation) under a reference temperature of 25° C. in the condition of the frequency being 1 MHz and the input signal level (measuring voltage) being 1.0 Vrms. The relative permittivity is the higher the better. In the present examples, it was preferably 40 or more, more preferably 50 or more, and particularly preferably 60 or more. The results were shown in Table 1.

<Temperature Characteristic of Electrostatic Capacity TCC>

The electrostatic capacity of the dielectric sample was measured under −55° C. to 125° C. in a condition of the frequency being 1 MHz and the input signal level (measuring voltage) being 1.0 Vrms. When the reference temperature was set to be 25° C., the temperature coefficient relative to temperature was preferred to be 1000 ppm/° C. or less, and more preferred to be 700 ppm/° C. or less. The coefficient of temperature characteristic TCC (ppm/° C.) was calculated with the following mathematical formula 1. In the mathematical formula 1, the $C_{125}$ represented electrostatic capacity under 125° C. and the $C_{25}$ represented electrostatic capacity under 25° C.

$$TCC(1\ MHz)=\{(C_{125}-C_{25})/C_{25}\}\times 100$$

<Measurement of the Mass Ratio of $Bi_{12}SiO_{20}$ and $Bi_2SiO_5$>

Firstly, the X-ray diffraction of the film sample was performed by a parallel beam method and the single plate sample was measured by a focusing method. Cu—Kα X-ray was used as an X-ray source. The measuring condition was the voltage of 45 kV and the range of 2θ=20° to 70°. The mass ratio of the crystalline phases was calculated by a quantitative analysis method, i.e., a matrix flushing method, using the obtained results of X-ray diffraction and reference intensity ratio of $Bi_{12}SiO_{20}$ and $Bi_2SiO_5$ obtained from PDF databases. The analysis of the measured data was carried out by using the analysis software of H'Pert High Score Plus. As for the reference code of the PDF database, 01-072-7675 was used for $Bi_{12}SiO_{20}$ and 01-075-1483 was used for $Bi_2SiO_5$. In order to get a result of the mass ratio with a higher accuracy, measuring number was 3 for one sample and the average value was calculated thereby.

The measured results were shown in Table 1.

The obtained intermediate was cut and polished to be a size of 10 mm×10 mm with a height of 1 mm. Then, it was annealed in a condition with a holding temperature being 400° C., a holding time being 5 days and an atmosphere of

TABLE 1

| Sample No. | Shape of sample (deposition method) | Mass ratio of the materials, i.e., $Bi_2O_3/SiO_2$ | Mass fraction of $Bi_{12}SiO_{20}$ (%) | Mass fraction of $Bi_2SiO_5$ (%) | Relative permittivity 1 MHz | TCC 1 MHz (ppm/° C.) |
|---|---|---|---|---|---|---|
| Example 1 | Thin film (sputtering method) | 46.1 | 99.0 | 1.0 | 42 | 132 |
| Example 2 | Thin film (sputtering method) | 45.0 | 96.1 | 3.9 | 45 | 315 |
| Example 3 | Thin film (sputtering method) | 44.5 | 94.8 | 5.2 | 51 | 373 |
| Example 4 | Thin film (sputtering method) | 34.9 | 69.9 | 30.1 | 64 | 566 |
| Example 5 | Thin film (sputtering method) | 28.9 | 54.5 | 45.5 | 75 | 621 |
| Example 6 | Thin film (sputtering method) | 12.9 | 13.2 | 86.8 | 93 | 619 |
| Example 7 | Thin film (sputtering method) | 8.1 | 0.8 | 99.2 | 97 | 753 |
| Example 8 | Thin film (PLD method) | 34.9 | 70.7 | 29.3 | 73 | 579 |
| Example 9 | Single plate | 34.9 | 70.3 | 29.7 | 59 | 548 |
| Example 10 | Single plate | 28.9 | 54.1 | 45.9 | 68 | 584 |
| Example 11 | Single plate | 12.9 | 13.0 | 87.0 | 87 | 599 |
| Comparative Example 1 | Thin film (sputtering method) | 46.5 | 100.0 | 0.0 | 38 | 145 |
| Comparative Example 2 | Thin film (sputtering method) | 7.8 | 0.0 | 100.0 | 102 | 1151 |

Example 8

Example 8 was a thin film capacitor prepared by forming a dielectric film using a PLD method. Firstly, $Bi_2O_3$ powders and $SiO_2$ powders were prepared respectively with the mass ratio of $Bi_2O_3$ and $SiO_2$ as the materials of the target of Example 8 as shown in Table 1. And a target for PLD was produced by using the same target preparing method as that in Example 1.

Next, a dielectric film composed of a crystalline phase represented by $Bi_{12}SiO_{20}$ and a crystalline phase represented by $Bi_2SiO_5$ was formed by a PLD method, and then the dielectric film with a thickness of 400 nm was formed by using the target for PLD on the obtained lower electrode structure with the same method as that in Example 1. The thin film capacitor of Example 8 was prepared with the same method as that of Example 1 except that the dielectric film was formed by a PLD method.

The obtained thin film capacitor of Example 8 was evaluated with the same method as that of Example 1. The results were shown in Table 1.

Examples 9 to 11

Examples 9 to 11 were examples of single plate capacitor.

Firstly, as for the starting materials of the dielectric layers of Examples 9 to 11, $Bi_2O_3$ powders and $SiO_2$ powders were prepared respectively with the mass ratio of $Bi_2O_3$ and $SiO_2$ being the same as shown in Table 1.

Subsequently, the materials and water were mixed with a ball mill, and the obtained mixture was dried under 100° C.

The mixed powders were melted in a condition with a holding temperature of 1000° C., a holding time of 1 hour and an atmosphere of air, and then quenched with cold water to prepare an intermediate.

air. A dielectric layer containing a crystalline phase represented by $Bi_{12}SiO_{20}$ and a crystalline phase represented by $Bi_2SiO_5$ as the main components was obtained.

As shown in FIG. 2, Ag electrode was coated on the obtained dielectric layer to obtain the single plate capacitor samples of Examples 9 to 11.

The single plate capacitor samples of Examples 9 to 11 obtained thereby were evaluated with the same method as that of Example 1. The results were shown in Table 1.

Comparative Example 1

Firstly, $Bi_2O_3$ powders and $SiO_2$ powders were prepared respectively with the mass ratio of $Bi_2O_3$ and $SiO_2$ of the starting material for the $Bi_{12}SiO_{20}$ target shown in Table 1. And a $Bi_{12}SiO_{20}$ target for sputtering was prepared by using the same method as that of Example 1.

The thin film capacitor sample of Comparative Example 1 was prepared with the same method as that of Example 1 except the mass ratio of the target for sputtering.

The thin film capacitor sample of Comparative Example 1 obtained thereby was evaluated with the same method as that of Example 1. The results were shown in Table 1.

Comparative Example 2

Firstly, $Bi_2O_3$ powders and $SiO_2$ powders were prepared respectively with the mass ratio of $Bi_2O_3$ and $SiO_2$ of the starting material for the $Bi_2SiO_5$ target shown in Table 1. And a $Bi_2SiO_5$ target for sputtering was prepared by using the same method as that of Example 1.

A thin film capacitor sample of Comparative Example 2 was prepared with the same method as that of Example 1 except the mass ratio of the target for sputtering.

The thin film capacitor sample of Comparative Example 2 obtained thereby was evaluated with the same method as that of Example 1. The results were shown in Table 1.

Examples 1 to 8

It could be confirmed from Table 1 that in the cases of the dielectric composition in which the main component contains a crystalline phase represented by $Bi_{12}SiO_{20}$ and a crystalline phase represented by $Bi_2SiO_5$, a high relative permittivity could be maintained and a good temperature characteristic of electrostatic capacity could be realized regardless of the deposition method.

Examples 9 to 11

It could be confirmed from Table 1 that in the cases of the dielectric composition containing a crystalline phase represented by $Bi_{12}SiO_{20}$ and a crystalline phase represented by $Bi_2SiO_5$, a high relative permittivity could be maintained and a good temperature characteristic of electrostatic capacity could be achieved even though the dielectric composition was made into a shape of single plate.

Examples 1 to 11

It could be known from Table 1 that as for the dielectric composition containing a crystalline phase represented by $Bi_{12}SiO_{20}$ and a crystalline phase represented by $Bi_2SiO_5$, the relative permittivity with a thin film shape was higher than that with a single plate shape.

Comparative Example 1 and Comparative Example 2

It could be seen from Table 1 that in the case that the dielectric composition was not the one containing a crystalline phase represented by $Bi_{12}SiO_{20}$ and a crystalline phase represented by $Bi_2SiO_5$, the relative permittivity and the temperature characteristic of electrostatic capacity could not be improved at the same time.

As described above, the present invention relates to a dielectric composition, a dielectric film and an electronic component. The present invention can provide a dielectric composition and a dielectric film which can maintain a high relative permittivity and show a good temperature characteristic of electrostatic capacity. Miniaturization and high performance of the electronic components using the dielectric composition can be realized. The present invention provides a widespread new technology for such as the thin film capacitor or the film high-frequency components or the like using a dielectric film.

DESCRIPTION OF REFERENCE NUMERALS

1: supporting substrate; 2: foundation layer; 3: lower electrode structure; 4: dielectric film; 5: upper electrode structure; 10: thin film capacitor; 6: dielectric layer; 7: electrode layer; 20: single plate capacitor

What is claimed is:

1. A capacitor comprising:
    a first electrode;
    a second electrode; and
    a dielectric film disposed between the first electrode and the second electrode, wherein the dielectric film is composed of a dielectric composition comprising a crystalline phase represented by a general formula of $Bi_{12}SiO_{20}$ and a crystalline phase represented by a general formula of $Bi_2SiO_5$ as the main components.

2. The capacitor according to claim 1, wherein the content of said crystalline phase represented by $Bi_2SiO_5$ is 5 mass % to 99 mass %.

3. The capacitor according to claim 1, wherein the content of said crystalline phase represented by $Bi_2SiO_5$ is 30 mass % to 99 mass %.

4. The capacitor according to claim 1, wherein a thickness of the dielectric film is in the range of from 50 nm to 2000 nm.

5. The capacitor according to claim 1, wherein a thickness of the dielectric film is in the range of from 200 nm to 2000 nm.

6. A capacitor comprising:
    a first electrode;
    a second electrode; and
    a dielectric layer disposed between the first electrode and the second electrode, wherein the dielectric layer is composed of a dielectric composition comprising a crystalline phase represented by a general formula of $Bi_{12}SiO_{20}$ and a crystalline phase represented by a general formula of $Bi_2SiO_5$ as the main components; wherein a thickness of the dielectric layer is in the range of from 0.1 mm to 3 mm.

* * * * *